(12) United States Patent
Hu

(10) Patent No.: US 9,698,177 B1
(45) Date of Patent: Jul. 4, 2017

(54) METHOD FOR MANUFACTURING N-TYPE TFT

(71) Applicants: Shenzhen China Star Optoelectronics Technology Co., Ltd., Shenzhen (CN); Wuhan China Star Optoelectronics Technology Co., Ltd., Wuhan (CN)

(72) Inventor: Guoren Hu, Shenzhen (CN)

(73) Assignees: SHENZHEN CHINA STAR OPTOELECTRONICS TECHNOLOGY CO., LTD., Shenzhen, Guangdong (CN); WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 106 days.

(21) Appl. No.: 14/892,572

(22) PCT Filed: Oct. 28, 2015

(86) PCT No.: PCT/CN2015/093109
§ 371 (c)(1),
(2) Date: Nov. 19, 2015

(87) PCT Pub. No.: WO2017/070868
PCT Pub. Date: May 4, 2017

(30) Foreign Application Priority Data

Oct. 26, 2015 (CN) .......................... 2015 1 0703744

(51) Int. Cl.
*H01L 27/00* (2006.01)
*H01L 27/12* (2006.01)
(Continued)

(52) U.S. Cl.
CPC ...... *H01L 27/1281* (2013.01); *H01L 27/1222* (2013.01); *H01L 29/458* (2013.01);
(Continued)

(58) Field of Classification Search
None
See application file for complete search history.

(56) References Cited

U.S. PATENT DOCUMENTS

2001/0000756 A1* 5/2001 Batra ................ H01L 21/26506
438/149
2004/0211961 A1* 10/2004 Koo ..................... H01L 27/1229
257/59

(Continued)

*Primary Examiner* — Alexander Ghyka
(74) *Attorney, Agent, or Firm* — Leong C. Lei

(57) ABSTRACT

The present invention provides a method for manufacturing the N-type TFT, which includes subjecting a light shielding layer to a grating like patternization treatment for controlling different zones of a poly-silicon layer to induce difference of crystallization so as to have different zones of the poly-silicon layer forming crystalline grains having different sizes, whereby through just one operation of ion doping, different zones of the poly-silicon layer have differences in electrical resistivity due to difference of grain size generated under the condition of identical doping concentration to provide an effect equivalent to an LDD structure for providing the TFT with a relatively low leakage current and improved reliability. Further, since only one operation of ion injection is involved, the manufacturing time and manufacturing cost can be saved, damages of the poly-silicon layer can be reduced, the activation time can be shortened, thereby facilitating the manufacture of flexible display devices.

13 Claims, 9 Drawing Sheets

(51) Int. Cl.
*H01L 29/786* (2006.01)
*H01L 29/49* (2006.01)
*H01L 29/45* (2006.01)
*H01L 29/51* (2006.01)
*H01L 29/66* (2006.01)
*H01L 27/32* (2006.01)
*G02F 1/1368* (2006.01)

(52) U.S. Cl.
CPC .......... *H01L 29/4908* (2013.01); *H01L 29/51* (2013.01); *H01L 29/518* (2013.01); *H01L 29/66765* (2013.01); *H01L 29/78621* (2013.01); *H01L 29/78633* (2013.01); *H01L 29/78678* (2013.01); *G02F 1/1368* (2013.01); *G02F 2202/104* (2013.01); *H01L 27/3262* (2013.01)

(56) References Cited

U.S. PATENT DOCUMENTS

| | | | | |
|---|---|---|---|---|
| 2008/0286914 | A1* | 11/2008 | Makimura | G02F 1/13454 438/166 |
| 2011/0171769 | A1* | 7/2011 | You | H01L 21/2026 438/34 |
| 2012/0313114 | A1* | 12/2012 | Park | H01L 29/41733 257/88 |
| 2017/0047352 | A1* | 2/2017 | Wang | H01L 29/78621 |
| 2017/0084679 | A1* | 3/2017 | Jinta | H01L 51/504 |

\* cited by examiner

METHOD FOR MANUFACTURING N-TYPE TFT

BACKGROUND OF THE INVENTION

1. Field of the Invention

The present invention relates to a semiconductor manufacturing process, and in particular to a method for manufacturing an N-type thin-film transistor (TFT).

2. The Related Arts

Flat panel display devices have various advantages, such as thin device body, low power consumption, and being free of radiation and have a wide range of application. Flat panel display devices that are currently available generally include liquid crystal displays (LCDs) and organic light emitting displays (OLEDs).

A thin-film transistor (TFT), which is an important constituent component of the flat panel display devices, can be formed on a glass substrate or a plastic substrate to serve as a switching device and a driving device involved in display devices, such as LCDs and OLEDs.

Based on the carrier that forms an electric current in an TFT, TFTs can be divided into two types, including an N-type TFT (which uses electrons as the carriers) and a P-type TFT (which uses electric holes as the carriers).

The N-type TFT has a relatively large leakage current. To improve the reliability of the N-type TFT, the state of the art is such that a lightly doped drain (LDD) is arranged at each of two opposite sides of a channel of a semiconductor layer of the N-type TFT. The LDD is used to reduce the leakage current.

A conventional process for manufacturing an N-type TFT that involves an LDD structure comprises the following steps:

Step 1: as shown in FIG. 1, providing a substrate 100, depositing a light shielding layer on the substrate 100, and subjecting the light shielding layer to patterning to obtain a unitary light shielding bar 210.

Step 2: as shown in FIG. 2, sequentially depositing a buffer layer 200 and an amorphous silicon layer on the unitary light shielding bar 210 and the substrate 100 and subjecting the amorphous silicon layer to dehydrogenation treatment by applying an excimer laser annealing process to convert the amorphous silicon layer into a poly-silicon layer 300.

As shown in FIG. 3, the poly-silicon layer 300 obtained with Step 2 has grains of which the size is generally consistent.

Step 3: as shown in FIG. 4, coating a photoresist layer 400' on the poly-silicon layer 300, subjecting the photoresist layer 400' to exposure and development by applying a photolithographic process to expose two end portions of the poly-silicon layer 300, subjecting the two end portions of the poly-silicon layer 300 to N-type heavy doping by using the photoresist layer 400' as a shielding layer, and removing the photoresist layer 400'.

Step 4: as shown in FIG. 5, depositing a gate insulation layer 400 on the poly-silicon layer 300.

Step 5: as shown in FIGS. 6 and 7, depositing and patterning a gate conductor film on the gate insulation layer 400 to obtain a gate conductor layer 500, wherein the gate conductor layer 500 has a length smaller than a length of the photoresist layer 400' of Step 3 in order to expose parts of the un-doped portion of the poly-silicon layer 300 of Step 3, and performing one N-type light doping operation with the gate conductor layer 500 as a shielding layer so as to obtain N-type heavily doped zones 310, N-type lightly doped zones 320, and a channel zone 330.

The N-type lightly doped zones 320 constitute an LDD.

Step 6: subsequently performing a generally-used semiconductor manufacturing process, such as depositing an interlayer insulation layer and etching the interlayer insulation layer and the gate insulation layer 400 to form contact holes, depositing and etching a metal layer to form a source electrode, a drain electrode, and a gate electrode to finally form a N-type TFT having an LDD structure.

The above-described conventional process of manufacturing an N-type TFT having an LDD structure requires a photo mask to define the heavily doped zones and the lightly doped zones and needs to perform two times of ion doping. The steps of the process are numerous and the cost is relatively high. Further, since the heavily doped zones and the lightly doped zones often result in deviation in position alignment during the photolithographic operation, leading to undesired influence on the homogeneity of the TFT.

Another conventional process for manufacturing an N-type TFT having an LDD structure is using a half-tone mask to subject, in sequence, a gate electrode to two times of etching in such a way that the gate electrode that has been subjected to the first etching operation is used as a shielding layer for N-type heavy doping and the gate electrode that has been subjected to the second etching operation is used as a shielding layer for N-type light doping in order to form the LDD. This process, although saving one mask, suffers hard control of the homogeneity of the two times of etching.

FIG. 8 shows the relationship between electrical resistivity of poly-silicon having different grain sizes and doping concentration. This plot shows, under the same doping concentration, poly-silicon having different grain sizes shows different electrical resistivity. Specifically, under the same doping concentration, the smaller the grain size of poly-silicon is, the greater the electrical resistivity would be. Thus, under the same doping concentration, it is possible to achieve an effect equivalent to an LDD structure by controlling the grain size of poly-silicon.

SUMMARY OF THE INVENTION

An object of the present invention is to provide a method for manufacturing an N-type thin-film transistor (TFT), which makes use of the property that, under the same doping concentration, poly-silicon having different grain sizes show different electrical resistivity to achieve an effect of being equivalent to a lightly doped drain (LDD) structure through application of just one operation of ion doping so as to reduce manufacturing time and manufacturing cost.

To achieve the above object, the present invention provides a method for manufacturing an N-type TFT, which comprises the following steps:

(1) providing a substrate, depositing a light shielding layer on the substrate, and subjecting the light shielding layer to a grating like patternization treatment so as to obtain multiple mutually spaced independent light shielding blocks that are spaced from each other;

(2) sequentially depositing a buffer layer and an amorphous silicon layer on the multiple independent light shielding blocks and the substrate and having the amorphous silicon layer crystallized and converted into a poly-silicon layer, wherein the poly-silicon layer has first zones that correspond to the multiple independent light shielding blocks and have crystalline grains of a smallest size, second zones that correspond to separation spaces each between two adjacent ones of the independent light shielding blocks and have crystalline grains of a largest size, and remaining, third zones that have crystalline grains of an intermediate size;

(3) depositing a gate insulation layer on the poly-silicon layer;

(4) depositing and patterning a conductive film on the gate insulation layer to obtain a gate conductor layer, wherein the gate conductor layer is located exactly above the multiple mutually spaced independent light shielding blocks with the third zones and parts of the first zones of the poly-silicon layer exposed at two opposite sides thereof;

(5) subjecting the poly-silicon layer to one N-type ion doping operation by using the gate conductor layer as a shielding layer, wherein the N-type ion doped third zones of the poly-silicon layer have electrical resistivity that is smaller than electrical resistivity of the parts of the N-type ion doped first zones of the poly-silicon layer so that the parts of the N-type ion doped first zones of the poly-silicon layer are equivalent to lightly-doped zones.

The method for manufacturing the N-type TFT further comprises:

(6) depositing an interlayer insulation layer on the gate conductor layer and the gate insulation layer and subjecting the interlayer insulation layer and the gate insulation layer to a patternization treatment to form a first contact hole that exposes a part of a surface of the gate conductor layer and a second contact hole and a third contact hole that are respectively located at two opposite sides of the gate conductor layer and expose parts of surfaces of the N-type ion doped third zones of the poly-silicon layer; and (7) depositing and patterning a metal layer on the interlayer insulation layer to form a gate electrode that is connected via the first contact hole with the gate conductor layer and a source electrode and a drain electrode that are respectively connected, via the second contact hole and the third contact hole, with the N-type ion doped third zones of the poly-silicon layer.

The substrate comprises a glass substrate or a plastic substrate.

In step (2), the amorphous silicon layer is subjected to a dehydrogenation treatment by applying an excimer laser annealing process to have the amorphous silicon layer crystallized and converted into the poly-silicon layer.

The number of the multiple mutually spaced independent light shielding blocks is three or more than three.

In step (1), the light shielding layer is formed of a material of metal.

The buffer layer, the gate insulation layer, and the interlayer insulation layer are each formed of a material comprising silicon oxide, silicon nitride, or a combination thereof; and the gate conductor layer, the gate electrode, the source electrode, and the drain electrode are each formed of one of molybdenum, titanium, aluminum, and copper, or a stacked combination of multiple ones thereof.

The method for manufacturing the N-type TFT is applicable to manufacturing one of an active-matrix liquid crystal display (AMLCD), an active matrix organic light emitting diode (AMOLED), and a flexible display component.

The present invention also provides a method for manufacturing an N-type TFT, which comprises the following steps:

(1) providing a substrate, depositing a light shielding layer on the substrate, and subjecting the light shielding layer to a grating like patternization treatment so as to obtain multiple mutually spaced independent light shielding blocks that are spaced from each other;

(2) sequentially depositing a buffer layer and an amorphous silicon layer on the multiple independent light shielding blocks and the substrate and having the amorphous silicon layer crystallized and converted into a poly-silicon layer, wherein the poly-silicon layer has first zones that correspond to the multiple independent light shielding blocks and have crystalline grains of a smallest size, second zones that correspond to separation spaces each between two adjacent ones of the independent light shielding blocks and have crystalline grains of a largest size, and remaining, third zones that have crystalline grains of an intermediate size;

(3) depositing a gate insulation layer on the poly-silicon layer;

(4) depositing and patterning a conductive film on the gate insulation layer to obtain a gate conductor layer, wherein the gate conductor layer is located exactly above the multiple mutually spaced independent light shielding blocks with the third zones and parts of the first zones of the poly-silicon layer exposed at two opposite sides thereof;

(5) subjecting the poly-silicon layer to one N-type ion doping operation by using the gate conductor layer as a shielding layer, wherein the N-type ion doped third zones of the poly-silicon layer have electrical resistivity that is smaller than electrical resistivity of the parts of the N-type ion doped first zones of the poly-silicon layer so that the parts of the N-type ion doped first zones of the poly-silicon layer are equivalent to lightly-doped zones;

and further comprising:

(6) depositing an interlayer insulation layer on the gate conductor layer and the gate insulation layer and subjecting the interlayer insulation layer and the gate insulation layer to a patternization treatment to form a first contact hole that exposes a part of a surface of the gate conductor layer and a second contact hole and a third contact hole that are respectively located at two opposite sides of the gate conductor layer and expose parts of surfaces of the N-type ion doped third zones of the poly-silicon layer; and (7) depositing and patterning a metal layer on the interlayer insulation layer to form a gate electrode that is connected via the first contact hole with the gate conductor layer and a source electrode and a drain electrode that are respectively connected, via the second contact hole and the third contact hole, with the N-type ion doped third zones of the poly-silicon layer;

wherein the substrate comprises a glass substrate or a plastic substrate; and wherein in step (2), the amorphous silicon layer is subjected to a dehydrogenation treatment by applying an excimer laser annealing process to have the amorphous silicon layer crystallized and converted into the poly-silicon layer.

The efficacy of the present invention is that the present invention provides a method for manufacturing an N-type TFT, which includes subjecting a light shielding layer to a grating like patternization treatment for controlling different zones of a poly-silicon layer to induce difference of crystallization so as to have different zones of the poly-silicon layer forming crystalline grains having different sizes, whereby through just one operation of ion doping, different zones of the poly-silicon layer have differences in electrical resistivity due to difference of grain size generated under the condition of identical doping concentration to provide an effect equivalent to an LDD structure for providing the TFT with a relatively low leakage current and improved reliability. Further, since only one operation of ion injection is involved, the manufacturing time and manufacturing cost can be saved, damages of the poly-silicon layer can be reduced, the activation time can be shortened, thereby facilitating the manufacture of flexible display devices.

BRIEF DESCRIPTION OF THE DRAWINGS

For better understanding of the features and technical contents of the present invention, reference will be made to the following detailed description of the present invention and the attached drawings. However, the drawings are provided for the purposes of reference and illustration and are not intended to impose limitations to the present invention.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 9:
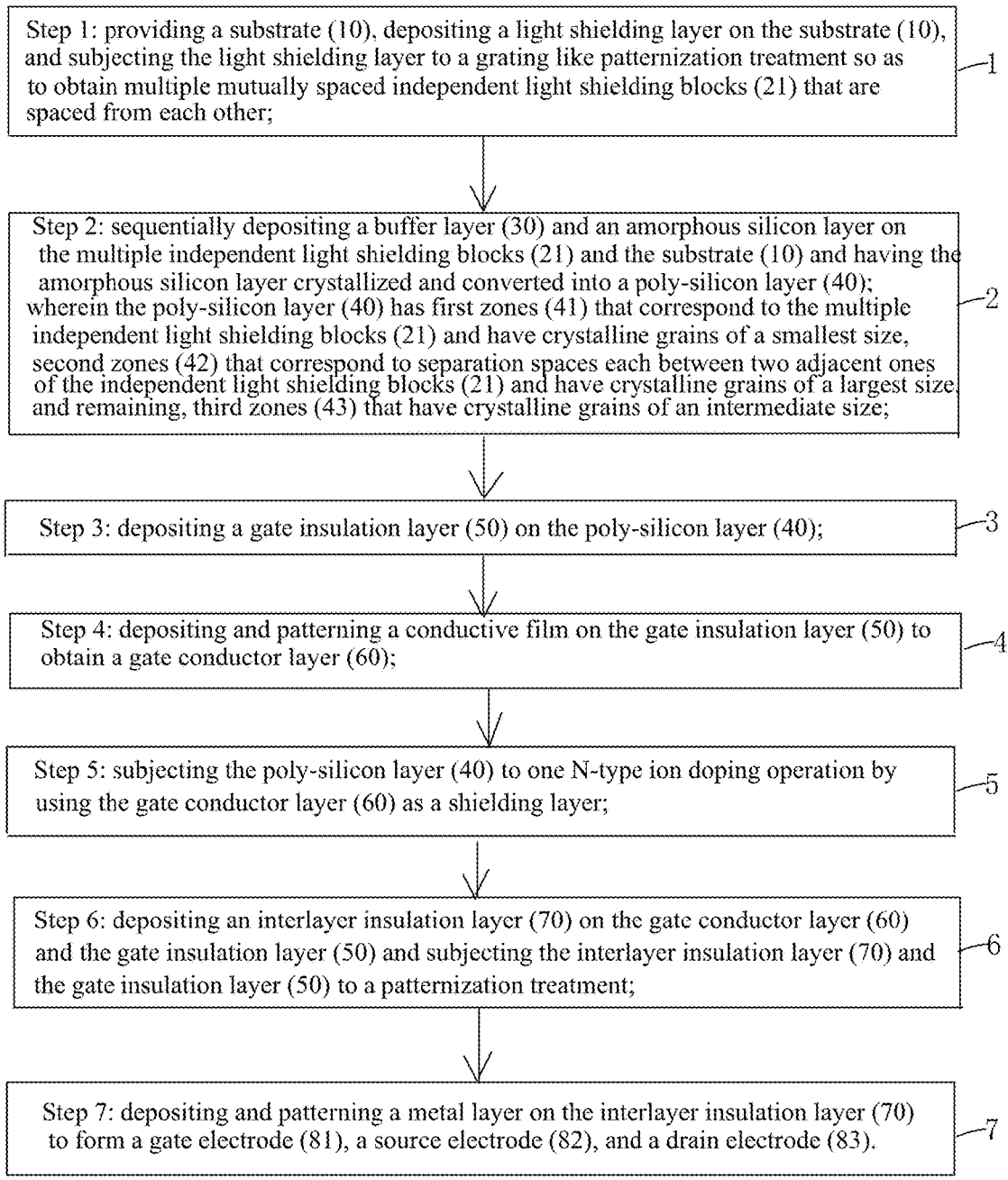
FIG. 9 is a flow chart illustrating a method for manufacturing an N-type TFT according to the present invention.
Figure 10:
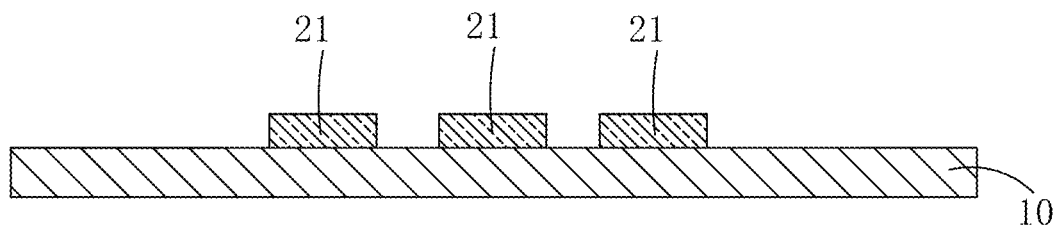
FIG. 10 is a schematic view illustrating step 1 of the method for manufacturing the N-type TFT according to the present invention.

Referring to FIG. 9, the present invention provides a method for manufacturing a N-type thin-film transistor (TFT), which comprises the following steps:

Step 1: as shown in FIG. 10, providing a substrate 10, depositing a light shielding layer on the substrate 10, and subjecting the light shielding layer to a grating like patternization treatment so as to obtain multiple mutually spaced independent light shielding blocks 21 that are spaced from each other.

Specifically, the substrate 10 may comprise a glass substrate or a plastic substrate.

The light shielding layer is formed of a material of metal. Preferably, the number of the multiple mutually spaced independent light shielding blocks 21 is three or more than three. As shown in FIG. 10, the three mutually spaced independent light shielding blocks 21 define therebetween two separation spaces.

Figure 11:
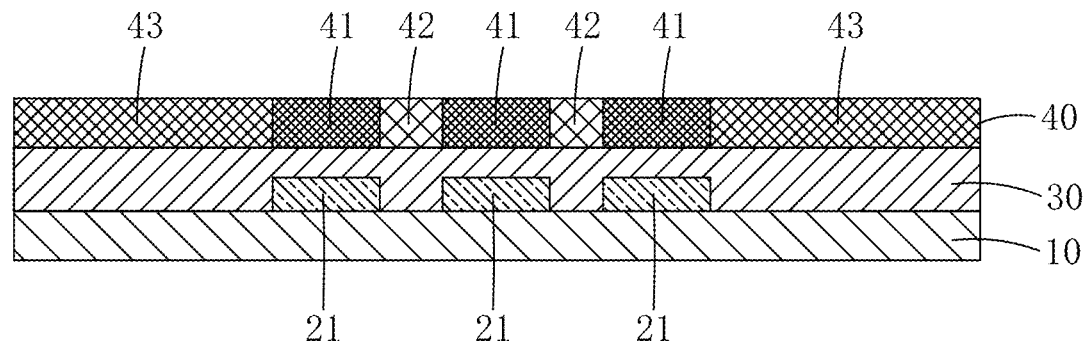
FIG. 11 is a schematic view illustrating step 2 of the method for manufacturing the N-type TFT according to the present invention.

Step 2: as shown in FIG. 11, sequentially depositing a buffer layer 30 and an amorphous silicon layer on the multiple independent light shielding blocks 21 and the substrate 10 and subjecting the amorphous silicon layer to a dehydrogenation treatment by applying an excimer laser annealing process to have the amorphous silicon layer crystallized and converted into a poly-silicon layer 40.

Figure 12:
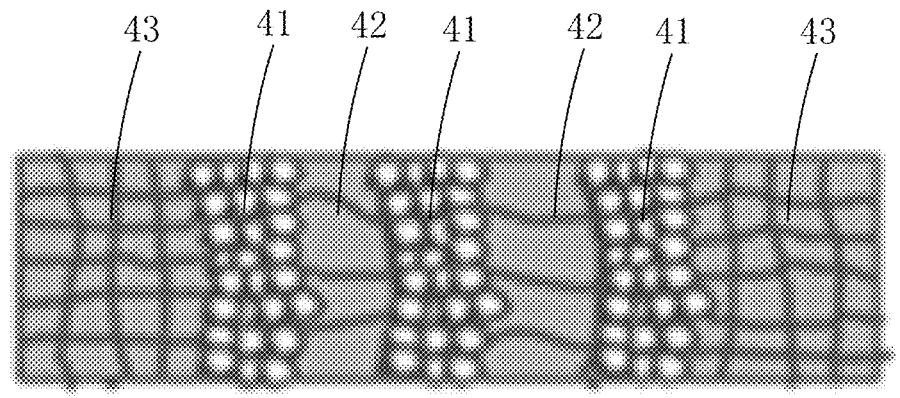
FIG. 12 is a top plan view of a poly-silicon layer of FIG. 11.

Due to the arrangement of the multiple mutually spaced independent light shielding blocks 21, during the crystallization and conversion of the amorphous silicon layer into the poly-silicon layer 40, temperature differences exist among different zones so that difference of crystallization is induced in different zones of the poly-silicon layer 40 thereby making crystalline grains of the different zones of the poly-silicon layer 40 having different grain sizes. Referring collectively to FIGS. 11 and 12, the crystalline grains of first zones 41 of the poly-silicon layer 40 corresponding to the multiple independent light shielding blocks 21 have the smallest grain size; the crystalline grains of second zones 42 that correspond to the separation spaces each between two adjacent ones of the independent light shielding blocks 21 have the largest grain size; and the crystalline grains of the remaining zones, the third zones 43, have an intermediate grain size.

Specifically, the buffer layer 30 is formed of a material comprising silicon oxide (SiOx), silicon nitride (SiNx), a combination thereof.

Figure 13:
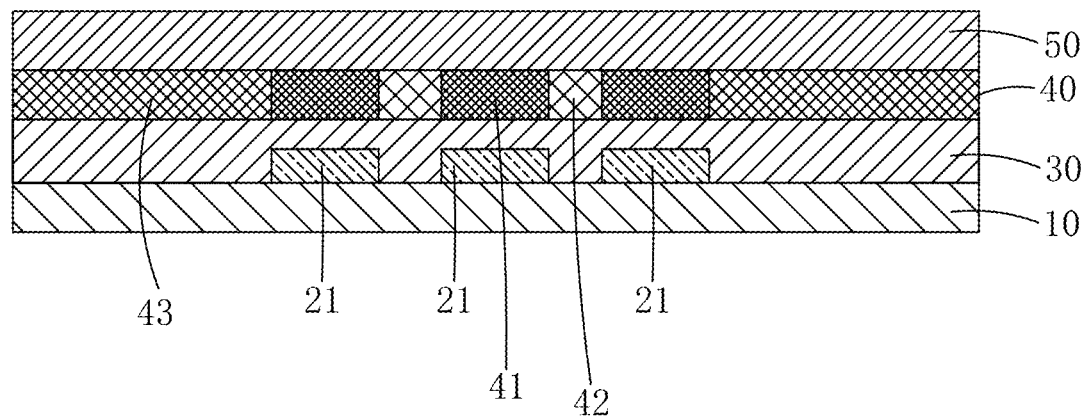
FIG. 13 is a schematic view illustrating step 3 of the method for manufacturing the N-type TFT according to the present invention.

Step 3: as shown in FIG. 13, depositing a gate insulation layer 50 on the poly-silicon layer 40.

Specifically, the gate insulation layer 50 is formed of a material comprising SiOx, SiNx, or a combination thereof.

Figure 14:
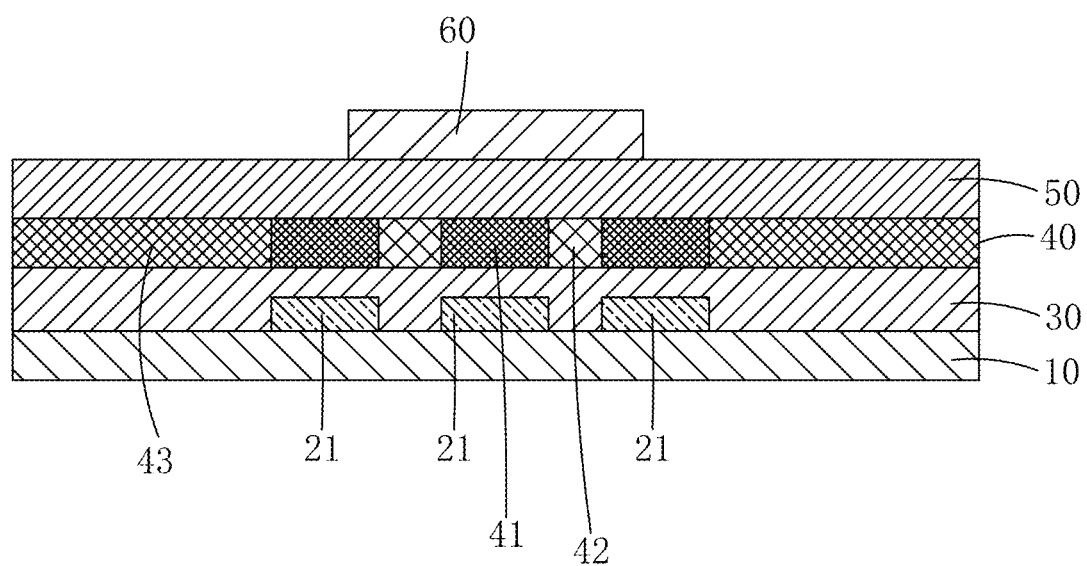
FIG. 14 is a schematic view illustrating step 4 of the method for manufacturing the N-type TFT according to the present invention.
Figure 15:
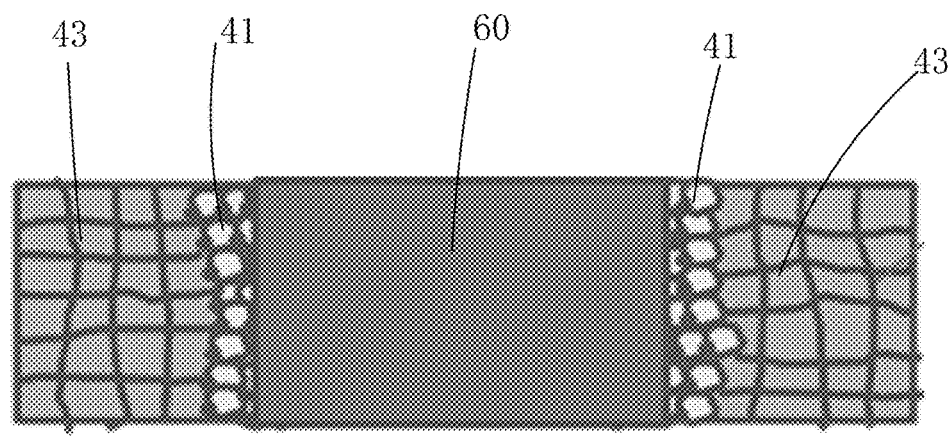
FIG. 15 is a top plan view of FIG. 14.

Step 4: as shown in FIGS. 14 and 15, depositing and patterning a conductive film on the gate insulation layer 50 to obtain a gate conductor layer 60.

The gate conductor layer 60 is located exactly above the multiple mutually spaced independent light shielding blocks 21 with the third zones 43 and parts of the first zones 41 of the poly-silicon layer 40 exposed at two opposite sides thereof.

Specifically, the gate conductor layer 60 is formed of a material comprising one of molybdenum (Mo), titanium (Ti), aluminum, (Al), and copper (Cu) or a stacked combination of multiple ones thereof.

Figure 16:
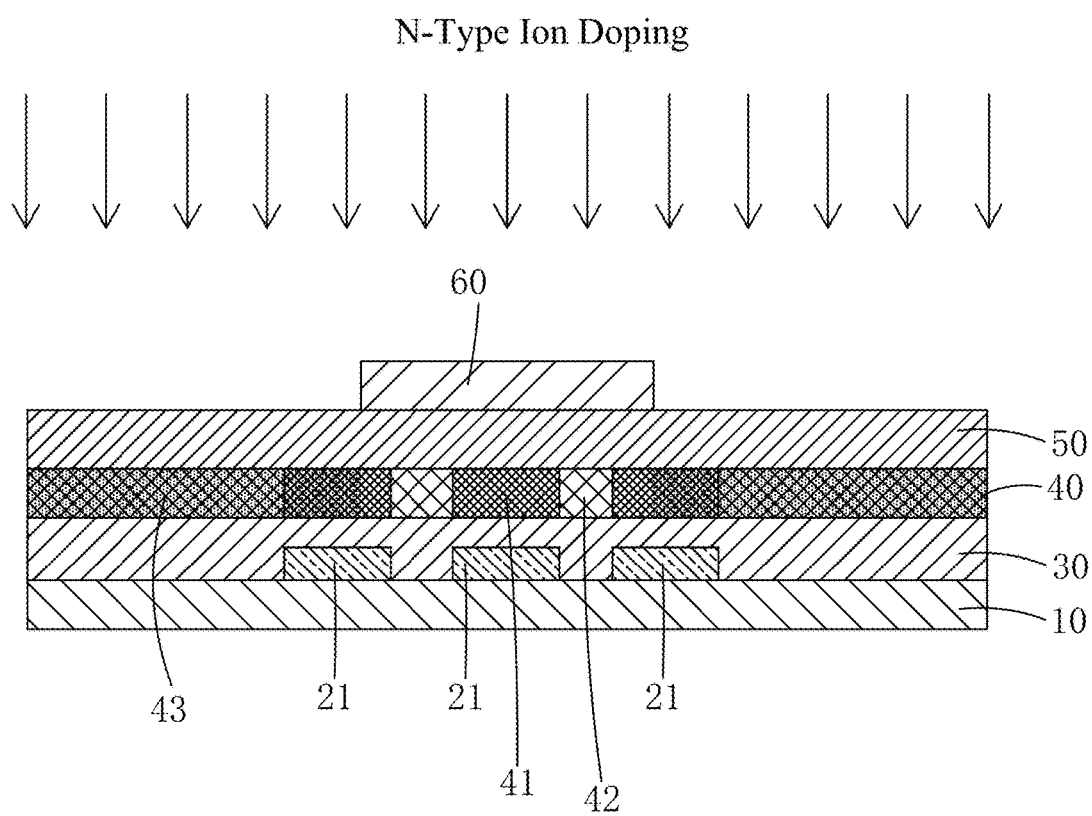
FIG. 16 is a schematic view illustrating step 5 of the method for manufacturing the N-type TFT according to the present invention.

Step 5: as shown in FIG. 16, subjecting the poly-silicon layer 40 to one N-type ion doping operation by using the gate conductor layer 60 as a shielding layer.

Figure 1:
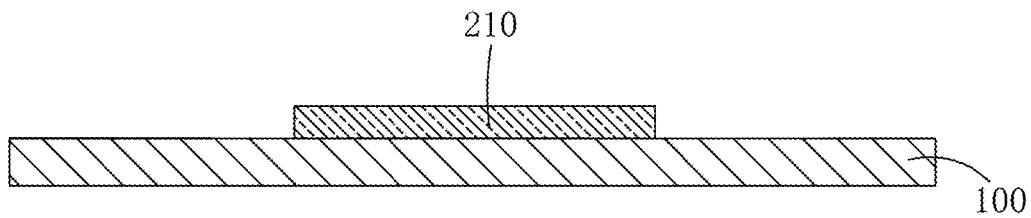
FIG. 1 is a schematic view illustrating step 1 of a conventional process for manufacturing an N-type thin-film transistor (TFT) that involves a lightly doped drain (LDD) structure.
Figure 2:
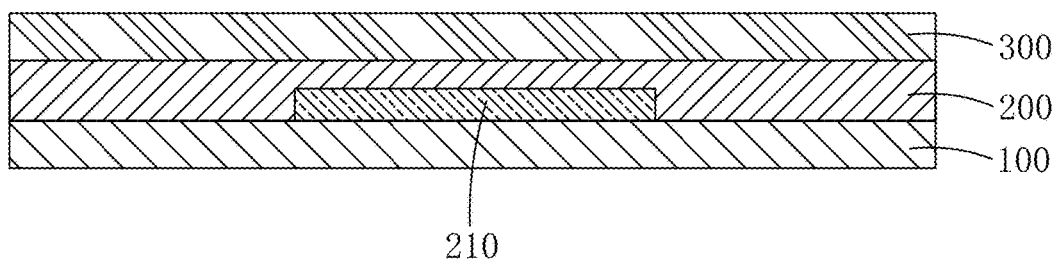
FIG. 2 is a schematic view illustrating step 2 of the conventional process for manufacturing the N-type TFT that involves an LDD structure.
Figure 3:
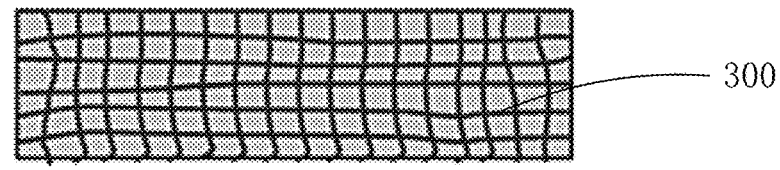
FIG. 3 is a top plan view illustrating a poly-silicon layer of FIG. 2.
Figure 4:
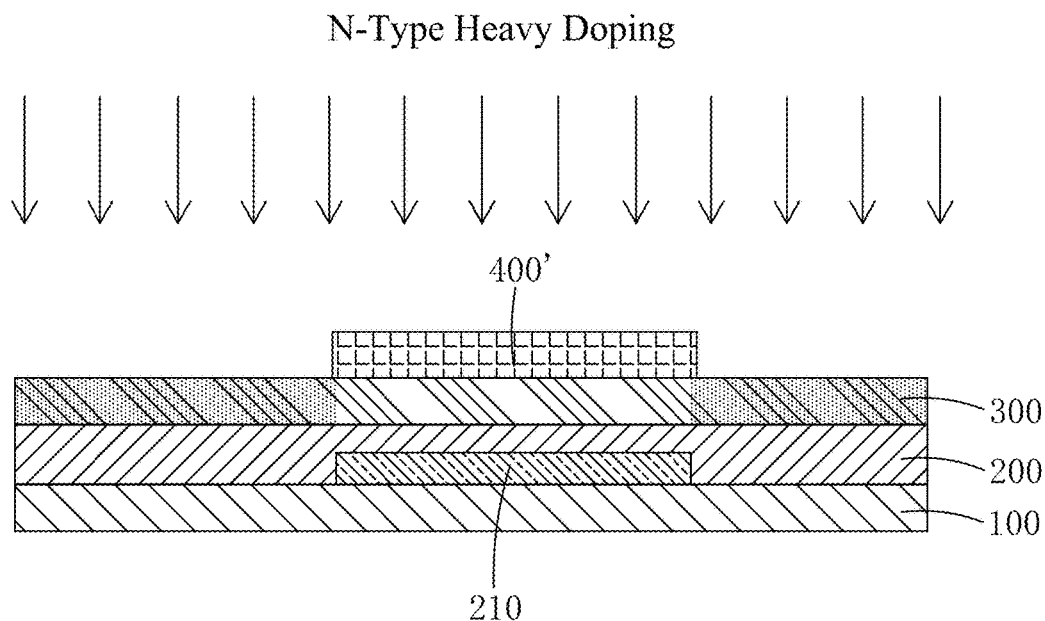
FIG. 4 is a schematic view illustrating step 3 of the conventional process for manufacturing the N-type TFT that involves an LDD structure.
Figure 5:
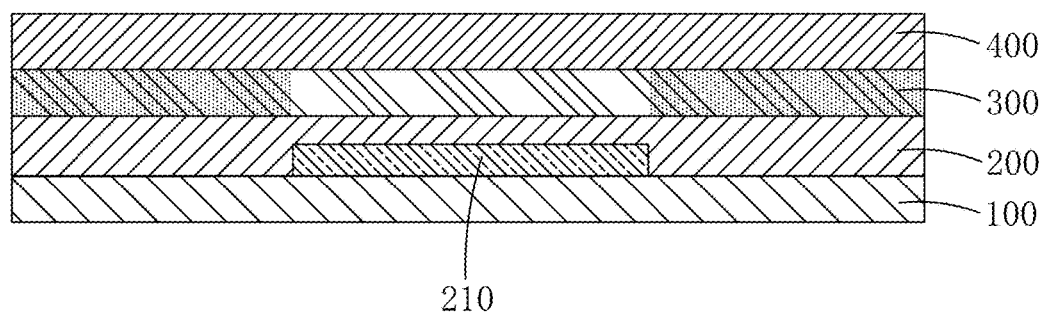
FIG. 5 is a schematic view illustrating step 4 of the conventional process for manufacturing the N-type TFT that involves an LDD structure.
Figure 6:
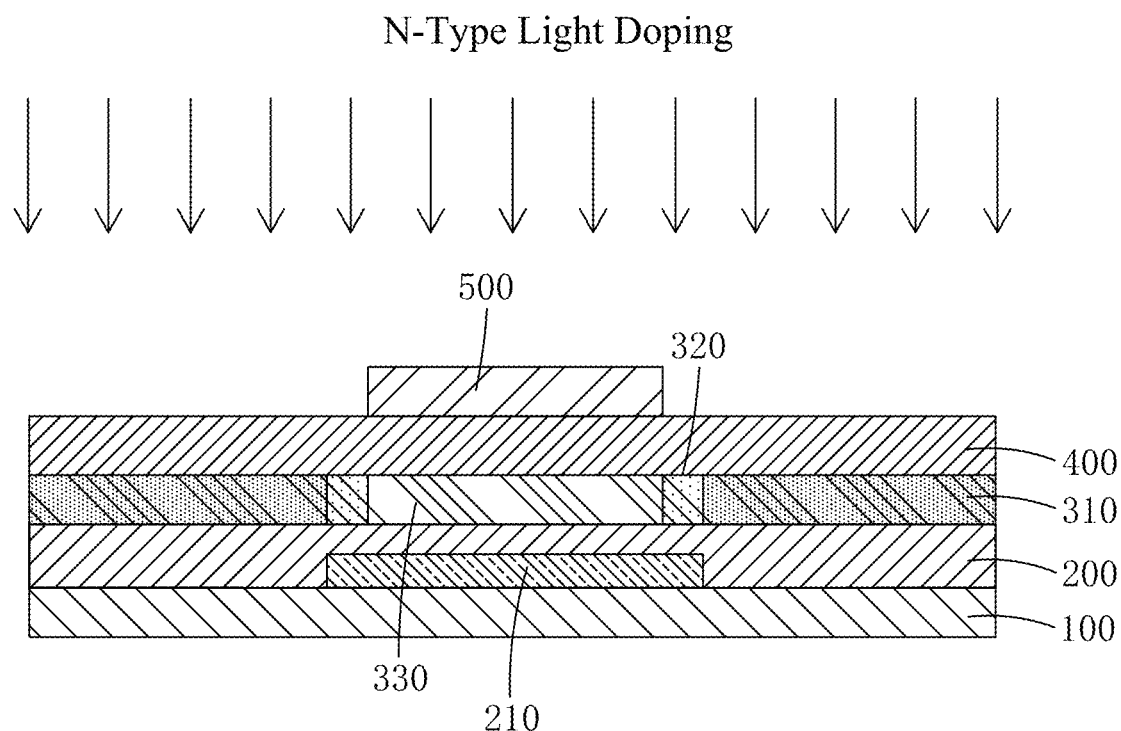
FIG. 6 is a schematic view illustrating step 5 of the conventional process for manufacturing the N-type TFT that involves an LDD structure.
Figure 7:
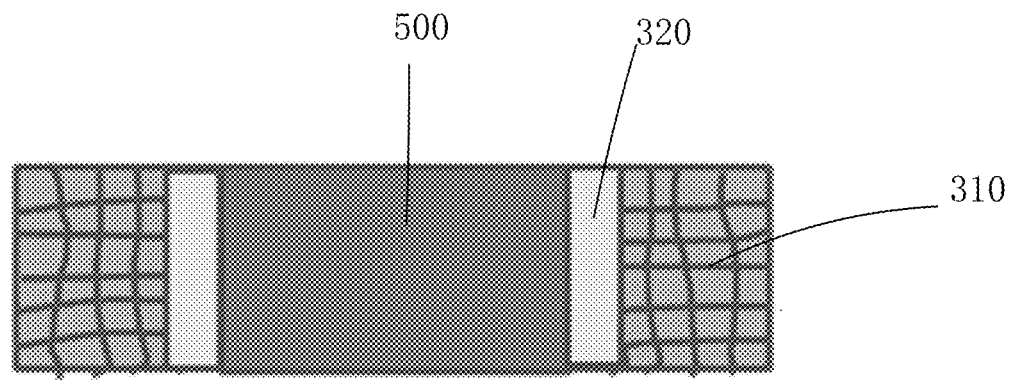
FIG. 7 is a top plan view of FIG. 6.
Figure 8:
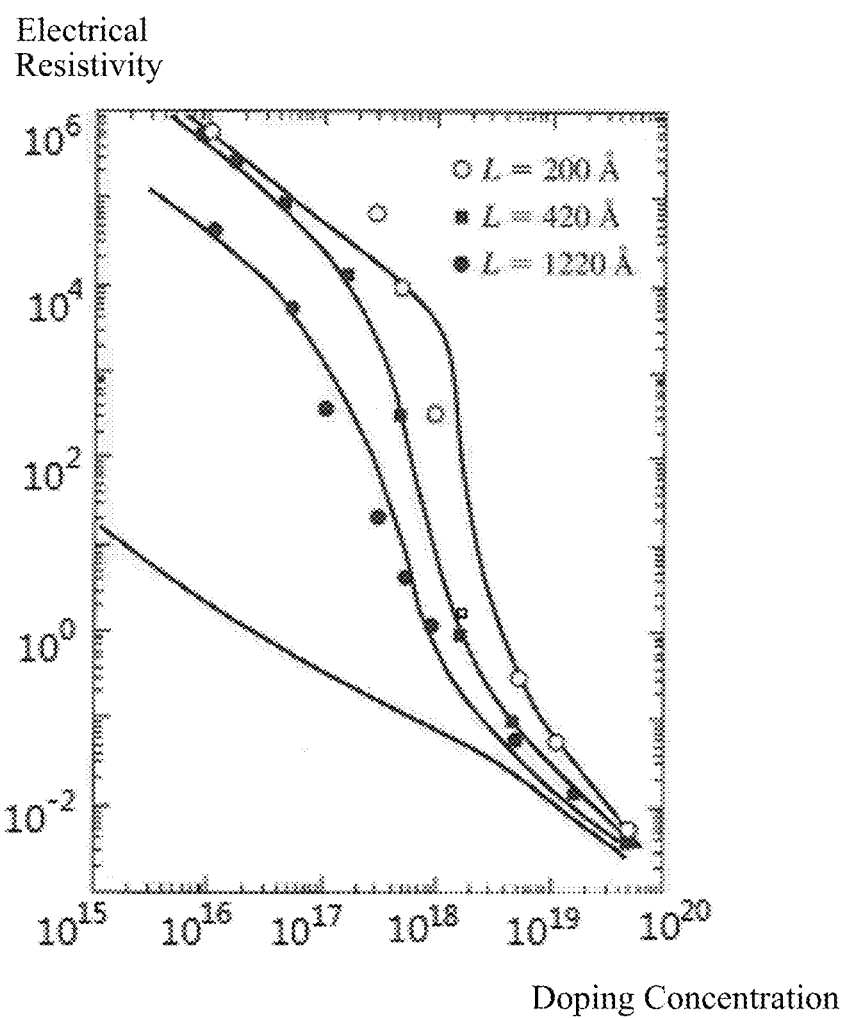
FIG. 8 is a plot illustrating curves of relationship between electrical resistivity of poly-silicon having different grain sizes and doping concentration.

In Step 5, the third zones 43 and the parts of the first zones 41 of the poly-silicon layer 40 that are not shielded by the gate conductor layer 60 are subjected to an N-type ion doping operation with the same concentration; however, since the crystalline grain size of the poly-silicon contained in the third zones 43 is greater than the crystalline grain size of the poly-silicon contained in the first zones 41, according to the illustration given in FIG. 8 that for the same doping concentration, the smaller the poly-silicon gran size is, the larger the electrical resistivity would be, the third zones 43 of the poly-silicon layer 40, after the N-type ion doping operation, has an electrical resistivity that is smaller than an electrical resistivity of the parts of the first zones 41 of the poly-silicon layer 40 after subjected to the N-type ion doping operation, so that the parts of the first zones 41 of the poly-silicon layer 40, after the N-type ion doping operation can be considered lightly doped zones, while the third zones 43 of the poly-silicon layer 40, after the N-type ion doping operation, can be regarded as N-type heavily doped zones. The second zones 42 and the remaining parts of the first zones 41 that have not been subjected to the N-type ion doping operation constitute a channel zone.

Figure 17:
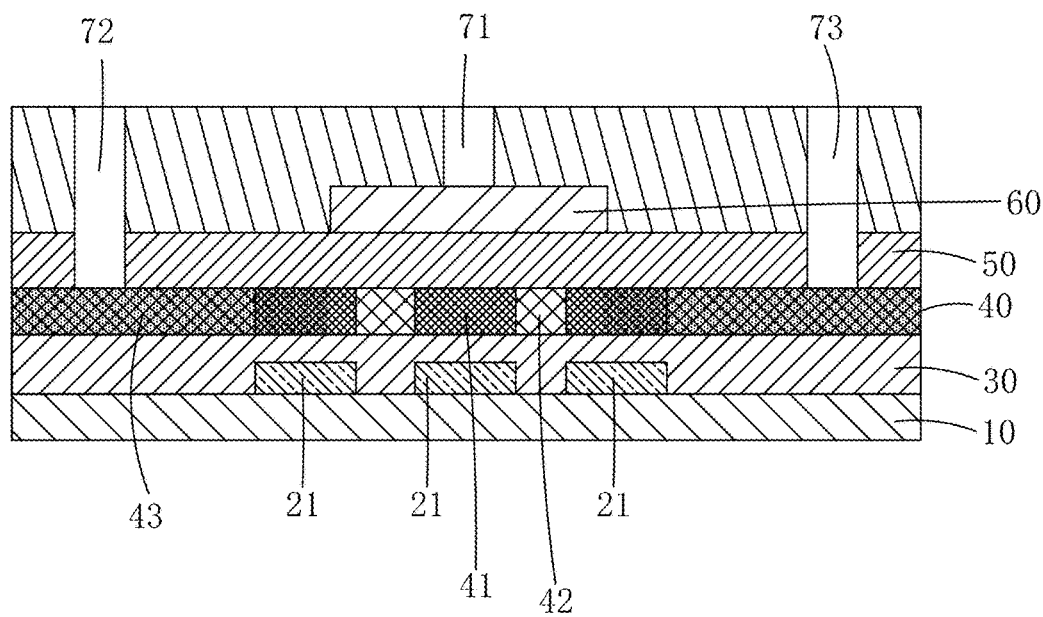
FIG. 17 is a schematic view illustrating step 6 of the method for manufacturing the N-type TFT according to the present invention.

Step 6: as shown in FIG. 17, depositing an interlayer insulation layer 70 on the gate conductor layer 60 and the gate insulation layer 50 and subjecting the interlayer insulation layer 70 and the gate insulation layer 50 to a patternization treatment to form a first contact hole 71 that exposes a part of a surface of the gate conductor layer 60 and a second contact hole 72 and a third contact hole 73 that are respectively located at two opposite sides of the gate conductor layer 60 and expose parts of surfaces of the N-type ion doped third zones 43 of the poly-silicon layer 40.

Specifically, the interlayer insulation layer 70 is formed of a material comprising SiOx, SiNx, or a combination thereof.

Figure 18:
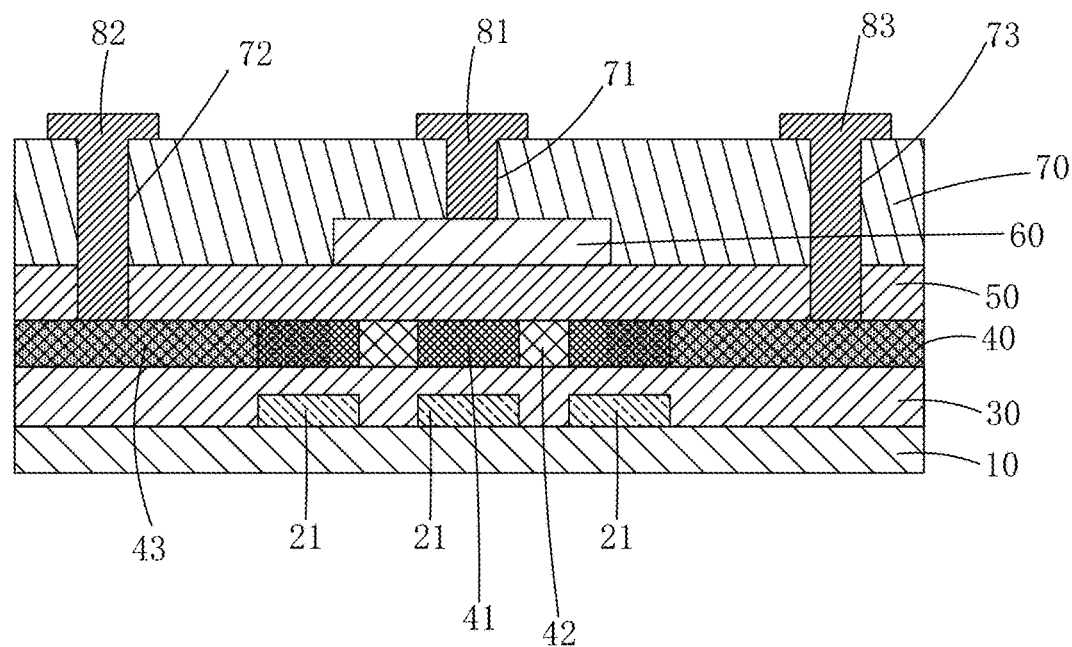
FIG. 18 is a schematic view illustrating step 7 of the method for manufacturing the N-type TFT according to the present invention.

Step 7: as shown in FIG. 18, depositing and patterning a metal layer on the interlayer insulation layer 70 to form a gate electrode 81 that is connected via the first contact hole 71 with the gate conductor layer 60 and a source electrode 82 and a drain electrode 83 that are respectively connected, via the second contact hole 72 and the third contact hole 73, with the N-type ion doped third zones 43 of the poly-silicon layer 40.

Specifically, the gate electrode 81, the source electrode 82, and the drain electrode 83 are each formed of a material comprising one of Mo, Ti, Al, and Cu or a stacked combination of multiple ones thereof.

The N-type TFT manufactured with the above-described method is equivalent in effect to one involving a light doping drain (LDD) so that the TFT has a relatively low leakage current and improved reliability. Further, this method requires only one operation of ion injection so that the manufacturing time and manufacturing cost can be saved, damages of the poly-silicon layer can be reduced, the activation time can be shortened.

The method for manufacturing an N-type TFT according to the present invention is applicable to manufacturing an active-matrix liquid crystal display (AMLCD), an active matrix organic light emitting diode (AMOLED), and a flexible display component.

In summary, the present invention provides a method for manufacturing an N-type TFT, which includes subjecting a light shielding layer to a grating like patternization treatment for controlling different zones of a poly-silicon layer to induce difference of crystallization so as to have different zones of the poly-silicon layer forming crystalline grains having different sizes, whereby through just one operation of ion doping, different zones of the poly-silicon layer have differences in electrical resistivity due to difference of grain size generated under the condition of identical doping concentration to provide an effect equivalent to an LDD structure for providing the TFT with a relatively low leakage current and improved reliability. Further, since only one operation of ion injection is involved, the manufacturing time and manufacturing cost can be saved, damages of the poly-silicon layer can be reduced, the activation time can be shortened, thereby facilitating the manufacture of flexible display devices.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an N-type thin-film transistor (TFT), comprising the following steps:
   (1) providing a substrate, depositing a light shielding layer on the substrate, and subjecting the light shielding layer to a grating like patternization treatment so as to obtain multiple mutually spaced independent light shielding blocks that are spaced from each other;
   (2) sequentially depositing a buffer layer and an amorphous silicon layer on the multiple independent light shielding blocks and the substrate and having the amorphous silicon layer crystallized and converted into a poly-silicon layer,
   wherein the poly-silicon layer has first zones that correspond to the multiple independent light shielding blocks and have crystalline grains of a smallest size, second zones that correspond to separation spaces each between two adjacent ones of the independent light shielding blocks and have crystalline grains of a largest size, and remaining, third zones that have crystalline grains of an intermediate size;
   (3) depositing a gate insulation layer on the poly-silicon layer;
   (4) depositing and patterning a conductive film on the gate insulation layer to obtain a gate conductor layer,
   wherein the gate conductor layer is located exactly above the multiple mutually spaced independent light shielding blocks with the third zones and parts of the first zones of the poly-silicon layer exposed at two opposite sides thereof; and
   (5) subjecting the poly-silicon layer to one N-type ion doping operation by using the gate conductor layer as a shielding layer, wherein the N-type ion doped third zones of the poly-silicon layer have electrical resistivity that is smaller than electrical resistivity of the parts of the N-type ion doped first zones of the poly-silicon layer so that the parts of the N-type ion doped first zones of the poly-silicon layer are equivalent to lightly-doped zones.

2. The method for manufacturing the N-type TFT as claimed in claim 1 further comprising:
   (6) depositing an interlayer insulation layer on the gate conductor layer and the gate insulation layer and subjecting the interlayer insulation layer and the gate insulation layer to a patternization treatment to form a first contact hole that exposes a part of a surface of the gate conductor layer and a second contact hole and a third contact hole that are respectively located at two opposite sides of the gate conductor layer and expose parts of surfaces of the N-type ion doped third zones of the poly-silicon layer; and
   (7) depositing and patterning a metal layer on the interlayer insulation layer to form a gate electrode that is connected via the first contact hole with the gate conductor layer and a source electrode and a drain electrode that are respectively connected, via the second contact hole and the third contact hole, with the N-type ion doped third zones of the poly-silicon layer.

3. The method for manufacturing the N-type TFT as claimed in claim 1, wherein the substrate comprises a glass substrate or a plastic substrate.

4. The method for manufacturing the N-type TFT as claimed in claim 1, wherein in step (2), the amorphous silicon layer is subjected to a dehydrogenation treatment by applying an excimer laser annealing process to have the amorphous silicon layer crystallized and converted into the poly-silicon layer.

5. The method for manufacturing the N-type TFT as claimed in claim 1, wherein the number of the multiple mutually spaced independent light shielding blocks is three or more than three.

6. The method for manufacturing the N-type TFT as claimed in claim 1, wherein in step (1), the light shielding layer is formed of a material of metal.

7. The method for manufacturing the N-type TFT as claimed in claim 1, wherein the buffer layer, the gate insulation layer, and the interlayer insulation layer are each formed of a material comprising silicon oxide, silicon nitride, or a combination thereof; and the gate conductor layer, the gate electrode, the source electrode, and the drain electrode are each formed of one of molybdenum, titanium, aluminum, and copper, or a stacked combination of multiple ones thereof.

8. The method for manufacturing the N-type TFT as claimed in claim 1, which is applicable to manufacturing one of an active-matrix liquid crystal display (AMLCD), an active matrix organic light emitting diode (AMOLED), and a flexible display component.

9. A method for manufacturing an N-type thin-film transistor (TFT), comprising the following steps:
  (1) providing a substrate, depositing a light shielding layer on the substrate, and subjecting the light shielding layer to a grating like patternization treatment so as to obtain multiple mutually spaced independent light shielding blocks that are spaced from each other;
  (2) sequentially depositing a buffer layer and an amorphous silicon layer on the multiple independent light shielding blocks and the substrate and having the amorphous silicon layer crystallized and converted into a poly-silicon layer,
  wherein the poly-silicon layer has first zones that correspond to the multiple independent light shielding blocks and have crystalline grains of a smallest size, second zones that correspond to separation spaces each between two adjacent ones of the independent light shielding blocks and have crystalline grains of a largest size, and remaining, third zones that have crystalline grains of an intermediate size;
  (3) depositing a gate insulation layer on the poly-silicon layer;
  (4) depositing and patterning a conductive film on the gate insulation layer to obtain a gate conductor layer,
  wherein the gate conductor layer is located exactly above the multiple mutually spaced independent light shielding blocks with the third zones and parts of the first zones of the poly-silicon layer exposed at two opposite sides thereof; and
  (5) subjecting the poly-silicon layer to one N-type ion doping operation by using the gate conductor layer as a shielding layer, wherein the N-type ion doped third zones of the poly-silicon layer have electrical resistivity that is smaller than electrical resistivity of the parts of the N-type ion doped first zones of the poly-silicon layer so that the parts of the N-type ion doped first zones of the poly-silicon layer are equivalent to lightly-doped zones;
  and further comprising:
  (6) depositing an interlayer insulation layer on the gate conductor layer and the gate insulation layer and subjecting the interlayer insulation layer and the gate insulation layer to a patternization treatment to form a first contact hole that exposes a part of a surface of the gate conductor layer and a second contact hole and a third contact hole that are respectively located at two opposite sides of the gate conductor layer and expose parts of surfaces of the N-type ion doped third zones of the poly-silicon layer; and
  (7) depositing and patterning a metal layer on the interlayer insulation layer to form a gate electrode that is connected via the first contact hole with the gate conductor layer and a source electrode and a drain electrode that are respectively connected, via the second contact hole and the third contact hole, with the N-type ion doped third zones of the poly-silicon layer;
  wherein the substrate comprises a glass substrate or a plastic substrate; and
  wherein in step (2), the amorphous silicon layer is subjected to a dehydrogenation treatment by applying an excimer laser annealing process to have the amorphous silicon layer crystallized and converted into the poly-silicon layer.

10. The method for manufacturing the N-type TFT as claimed in claim 9, wherein the number of the multiple mutually spaced independent light shielding blocks is three or more than three.

11. The method for manufacturing the N-type TFT as claimed in claim 9, wherein in step (1), the light shielding layer is formed of a material of metal.

12. The method for manufacturing the N-type TFT as claimed in claim 9, wherein the buffer layer, the gate insulation layer, and the interlayer insulation layer are each formed of a material comprising silicon oxide, silicon nitride, or a combination thereof; and the gate conductor layer, the gate electrode, the source electrode, and the drain electrode are each formed of one of molybdenum, titanium, aluminum, and copper, or a stacked combination of multiple ones thereof.

13. The method for manufacturing the N-type TFT as claimed in claim 9, which is applicable to manufacturing one of an active-matrix liquid crystal display (AMLCD), an active matrix organic light emitting diode (AMOLED), and a flexible display component.

* * * * *